United States Patent [19]

Kickelhain

[11] Patent Number: 5,576,073

[45] Date of Patent: Nov. 19, 1996

[54] METHOD FOR PATTERNED METALLIZATION OF A SUBSTRATE SURFACE

[75] Inventor: Joerg Kickelhain, Neustadt, Germany

[73] Assignee: LPKF CAD/CAM Systeme GmbH, Garbsen, Germany

[21] Appl. No.: 427,093

[22] Filed: Apr. 21, 1995

[30] Foreign Application Priority Data

Apr. 23, 1994 [DE] Germany .......................... 44 14 225.0

[51] Int. Cl.$^6$ ...................................................... B05D 5/12
[52] U.S. Cl. ............................ 427/555; 427/98; 427/304; 427/306; 427/443.1; 216/65
[58] Field of Search .......................... 427/98, 555, 443.1, 427/304, 306; 216/65

[56] References Cited

U.S. PATENT DOCUMENTS

| | | | |
|---|---|---|---|
| 3,791,340 | 2/1974 | Ferrara | 117/47 A |
| 4,508,749 | 4/1985 | Brannon et al. | 427/43.1 |
| 4,842,677 | 6/1989 | Wojnarowski et al. | 216/65 |
| 4,865,873 | 12/1989 | Cole, Jr. et al. | 427/555 |

OTHER PUBLICATIONS

Giesecke et al., "Herstellung flexibler Schaltungen mit Bayprint–eine zukunftsweisende Technologie", *Galvanotechnik*, vol. 84, No. 2, pp. 570–575 (1993). No month available.

*Primary Examiner*—Kathryn Gorgos
*Assistant Examiner*—Kishor Mayekar
*Attorney, Agent, or Firm*—Evenson, McKeown, Edwards & Lenahan, P.L.L.C.

[57] ABSTRACT

A method for patterned metallization of the surface of substrates (1), particularly circuit boards, using electromagnetic radiation (5) in which an electrically nonconducting prime coat (2) is applied full-surface to the substrate (circuit board 1); an electrically nonconducting cover coat which is easily ablated by electromagnetic irradiation (5) in the ultraviolet range is applied full-surface to the prime coating (2), the cover coat (4) being applied in a thickness that is at least equal to the thickness of the metal layer that is to be applied; the cover coat is removed from partial areas by the action of electromagnetic irradiation (5) in the ultraviolet range to form patterns (6) with sharp and steep flanks (7) and expose the prime coat (2); and in the area of the exposed patterns (6) on the prime coat (2), a metal layer is applied, guided by the flanks (7), in a reducing bath. The method facilitates patterned metallization with a very high resolution on the surface of substrates, without the need for an etching procedure.

16 Claims, 1 Drawing Sheet

METHOD FOR PATTERNED METALLIZATION OF A SUBSTRATE SURFACE

BACKGROUND OF THE INVENTION

The invention relates to a method for the patterned metallization of the surfaces of substrates, especially printed circuit boards, using electromagnetic radiation.

Published German Patent Application No. DE 3,922,478 discloses a method of this general kind. It describes the patterning of copper-coated polymer surfaces. Removal of a plastic coating and a remaining copper layer from between the conductors is performed by means of an excimer laser. It has been found, however, that the removal of a relatively thick copper layer by means of an excimer laser entails the production of heat, to such an extent that the edge sharpness necessary for patterning cannot be achieved. This signifies that a fine or superfine pattern, such as is ever more frequently desired, cannot be produced on such surfaces by means of an excimer laser. Furthermore, the removal of a relatively thick copper layer, such as a copper overlay, by means of an excimer laser is very time-consuming, so that a process of this kind was not practicable. Furthermore, if after removal of the spider by an excimer laser a galvanic conductor build-up is performed and followed by a differential etching process, it is impossible to achieve a fine or superfine edge on the conductors. Sharp edges of the necessary fineness are not achievable by the differential etching method since in this case undercutting of the conductors is unavoidable.

In particular, even the use of an etchant, which is necessary in the known processes, is not good from the environmental point of view. This is also true of the known method of disposing photosensitive layers on circuit boards wherein exposure to a light pattern causes a reaction which, after stripping, permits the conductors to be etched with a mordant.

In the periodical, Galvano Technik, 84 (1993), No. 2, pages 570 ff., in the article, "Herstellung flexibler Schaltungen mit Bayprint—eine zukunftsweisende Technologie" [production of flexible circuits with Bayprint, a pioneering technology], a process is described which operates without exposure to light and without etching. A polymer surface is imprinted with a primer, i.e., an adhesion-promoting coating, by the screen-printing method. The conductor patterns are here already established by the primer. The primer is nonconductive, adheres well to the polymer surface and, after a drying procedure, has on its surface a porous pattern which then permits the tight adhesion of a metal coating deposited on it without electric current. The metal coating then forms the conductor pattern. This process does have the advantage that it is relatively easy to perform; the disadvantage, however, is that the screen printing process is limited as regards the achievable fineness of the conductor pattern. The method described is not suitable, therefore, for the creation of very fine conductor webs of the kind ever more frequently sought. In this article, on page 571, first paragraph, it had already been proposed to provide polyimide materials with holes by penetration with an excimer laser. This makes use of the fact, known in itself, that polyimide is a very homogeneous material which can easily be ablated by the high photon energy of an excimer laser.

SUMMARY OF THE INVENTION

It is the object of the invention to provide a method which avoids the aforementioned disadvantages.

Another object of the invention is to provide a method which makes it possible to achieve a patterned metallization of the surface of substrates with a very high resolution, quickly, economically and without any etching procedure.

A further object of the invention is to provide a method which is particularly suitable for metallization of the surface of circuit boards.

It is also an object of the invention to provide a method which is rapid and economical.

These and other objects of the invention are achieved by providing a method for patterned metallization of a substrate surface comprising the steps of applying an electrically nonconductive prime coat to the full surface of the substrate; applying an electrically nonconductive cover coat to the full surface of the prime coat, the cover layer being removable by electromagnetic radiation in the ultraviolet range and being applied in a thickness approximately equal to that of a metal layer to be deposited in the metallization; removing partial areas of the cover coat by electromagnetic irradiation in the ultraviolet range to form a pattern having sharp and steep flanks and expose the prime coat in the partial areas; and depositing a metal layer on the exposed prime coat in the partial areas to form electrical conductors, the deposition of the metal being effected in a reducing bath and being guided by the flanks of the cover layer pattern.

Inasmuch as an electrically nonconductive prime coat is applied to the entire surface of the substrate (printed-circuit board 1), an easily removable, electrically nonconductive cover coat is applied to the entire surface of the prime coat, the cover coat is applied in a thickness that is equal to the thickness of the metal coat that is to be applied, the cover coat is removed by applying electromagnetic radiation in the ultraviolet range with the formation of patterns with sharp and steep flanks and exposing the prime coat, and, in the area of the patterns exposed on the prime coat, and guided by its flanks, a metal coat is applied in a reductive bath for the formation of conductor webs, it is made possible to apply conductors and insulating channels with extremely great sharpness of contour. With the exposure of the prime coat, patterns are produced which have especially pronounced sharp-edged and steep flanks. The conductor webs then applied with the guidance of the flanks consequently also have sharp-edged and steep flanks.

Preferably, the removal of the cover coat is performed by means of an excimer laser, e.g., a krypton-fluoride excimer laser with a wavelength of 248 nm. Particularly in the case of polyimide materials, the removal of the cover coat takes place without any production of heat, so that for this reason too patterns can be achieved with clean and steep flanks. No burn-out or fusion whatever is produced on the flanks of the patterns. On this account the free space required for the isolation lines between the conductors can then also be kept extremely small. It is important that the removal, i.e., the ablation, is performed to such an extent that the prime coat is completely uncovered. But at the same time it is entirely permissible for the prime coat to be removed down to a certain residual thickness. Precise limitation of the depth of penetration of the laser is thus by no means necessary, which simplifies the practice of the method and improves its reliability.

Since according to the invention the final metallization is performed within the pattern lines thus created, the conductors are built up with great precision, guided by the flanks of the cover coat, up to approximately the surface of the cover coat, which is applied preferably in a thickness which corresponds to the thickness of the anticipated metallization.

The so-called chemical "mushrooming" that occurs in conventional metallization processes cannot occur since the metal build-up is guided on the flanks. As a result—especially when a krypton-fluoride excimer laser with a wavelength of 248 nm, is used —conductors and/or isolating lines can be applied with maximum resolution, i.e., with a very small width of about 0.3 μm to 1 μm. One of the results of this is the possibility of using the method of the invention even as a wiring method in the chip-on-board, chip-on-flex and in the "smart card" field.

The prime coat can be made to adhere tightly to the substrate by methods known in themselves, such as brushing, spraying, printing, dipping or precipitating. Preferably the prime coat is applied to the substrate in the form of a nonconductive paste. The prime coat also contains components which have a chemically reducing effect in the subsequent application of the metal coating. Forming the prime coat in this manner makes it possible to form the conductors by using a reducing bath, such as a copper bath, for example, to apply the metal coating to the prime coat exposed by the pattern.

The cover coat is preferably applied to the prime coat in a thickness that is approximately equal to the thickness of the future metal coat, the metal coat being deposited in the patterns up to the level of the surface of the cover coat surrounding it. The cover coat is preferably formed by a polymer, especially a polyimide or a polyethylene. It is, however, entirely plausible to use other materials. The important thing is that the material of the cover coat be able to be ablated in fine patterns by means of an electromagnetic irradiation in the ultraviolet range, with the formation of clean, steep flanks, and that it be electrically nonconductive and not metallizable in a reducing bath. It is also possible to apply the cover coat in the form of a polymer-base varnish which then can be stripped out after the patterns have been metallized. The conductors afterward stand out above the surface of the substrate. If desired, it may be advantageous if the cover coat is formed by a polymer that is heat-resistant during the soldering process.

According to a preferred embodiment of the invention the ablation of the cover coat from the substrate is performed by using a mask disposed in the beam path or by means of a known imaging or projection method. Alternatively it is possible to remove the cover coat by means of a focused laser beam. The methods mentioned make it possible to cause the laser beam or light to act on the cover coat in a controlled manner and in a fine pattern.

BRIEF DESCRIPTION OF THE DRAWINGS

The invention will be described in further detail hereinafter with reference to an illustrative preferred embodiment depicted in the accompanying drawings in which.

DETAILED DESCRIPTION OF PREFERRED EMBODIMENTS

Figure 1:
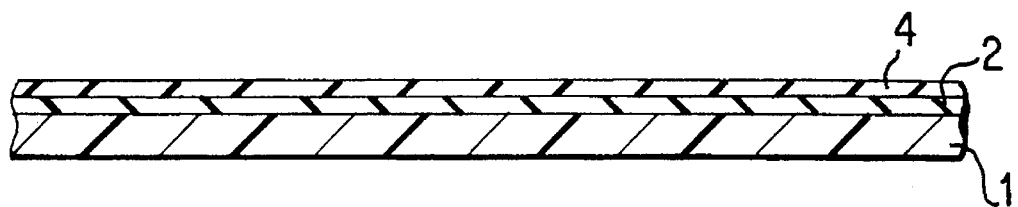
FIG. 1 is a cross section through a printed circuit after it is coated with the prime coat and the cover coat.

In the drawing, 1 indicates a printed-circuit board which consists in a known manner of a nonconductive polymer. A prime coat 2 is applied to the entire surface of the board in a thickness of about 2 μm to 10 μm. The prime coat 2 is applied, for example, by brushing, spraying, printing, dipping or precipitation. The prime coat 2 consists, for example, in accordance with U.S. Pat. No. 4,910,045 of Bayer AG, of the following components:

0.03–4.00 wt.-% of a catalytically active substance as activator.

3–40 wt.-% of a polyimide as binding agent.

1–30 wt.-% of a filler, and

45–90 wt.-% of a solvent.

The circuit board 1, together with the prime coat 2, is dried for one hour at a temperature of about 250° C. The solvent produces a good adherence of the prime coat 2 to the polymer surface of the circuit board 1. Furthermore, in the subsequent drying of the prime coat 2 a porous texture forms on its surface. This porous texture favors the strong adhesion of the additional coatings to be applied. The prime coat furthermore contains components which have a chemically reducing action in the subsequent application of a metal layer 3. This formation of the prime coat makes it possible later on to apply the metal layer 3 by means of a reducing bath without any electric current.

To the prime coat 2 a cover coat 4 is applied, which is preferably a polyimide or a polyethylene. The thickness of the cover coat 4 corresponds to the thickness of the metal layer 3 that is to be applied later to the exposed prime coat 2, and amounts preferably to about 5 to 20 μm. It is possible to apply the cover coat 4 in the form of a polymer-base varnish which after the metallization of the patterns 6 can be stripped off. The conductors formed then stand out above the surface of the circuit board 1. In some cases it may be advantageous if the cover coat 4 is made of a polymer that is heat resistant during the soldering process.

Figure 2:
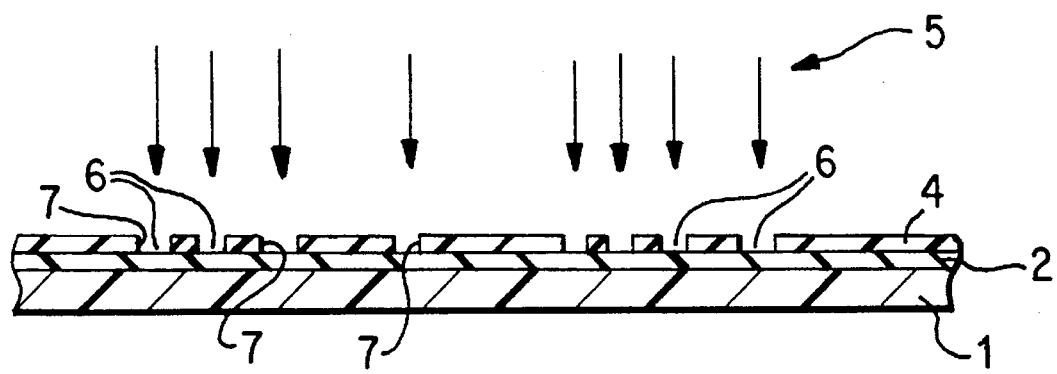
FIG. 2 is a cross section taken through the printed circuit of FIG. 1 with patterns created by the action of an excimer laser.

It can be seen in FIG. 2 of the drawing that the circuit board 1 is exposed partially to the radiation 5 of an excimer laser not represented in the drawing, preferably a krypton-fluoride excimer laser with a wavelength of 248 nm. Fundamentally, however, the use of excimer lasers with a wavelength of preferably 193 to 308 nm is possible. The radiation 5 causes an ablation of the cover coat 4 with the formation of patterns 6 with sharp and steep flanks 78. It is important that the cover coat 4 be removed completely down to the prime coat 2 in the area of the pattern 6. It is an advantage that the intensity of the radiation 5 from the excimer laser on the cover coat 4 can be well regulated by controlling the number of pulses. Since the ablation characteristic of each individual laser pulse is known, the cover coat 4 can removed cleanly leaving completely sharp edges in the area of the pattern 6, resulting in clean, steep flanks 7. It is, however, quite permissible to ablate also the prime coat 2 down to a certain residual thickness. Precise limitation of the depth of penetration of the laser is thus by no means necessary, which simplifies the performance of the process.

It has been additionally possible to make sure in a simple manner that the excimer laser removes only the cover coat 4, and that the prime coat 2, which is important to the subsequent metallization, remains always essentially intact. This is accomplished on the basis of the different consistency of the prime coat 2 and the cover coat placed thereon which is formed of an easily removable polymer, preferably a polyimide or polyethylene. The result is thus desirable ablation conditions at the phase boundary between the two coats 2 and 4. In any case the assurance is given that the excimer laser will remove the cover coat 4 entirely. The more difficultly removable, more reflective prime coat 2 remains substantially completely preserved if the laser parameters are properly chosen. Only at the upper phase boundary layer does a slight ablation occur. In general, the prime coat 2 can for this reason be removed down to a very slight depth. All that needs to be assured is the necessary adhesion to the surface of the circuit board and complete metallization. Also, the prime coat 2 applied to the circuit board 1 forms an ideal base for the metallization.

Basically, in the ablation of the cover coat 4 the bonding energy of the material is easily overcome by the high photon energy, especially excimer laser radiation, so that an extremely rapid ablation of material takes place without any heating. As a result, the cover coat 4 is cut away at the point of ablation with extraordinary sharpness. It is thus possible to produce extremely fine patterns 6 in the cover coat 4, with a width of up to about 0.3 µm and with steep flanks 7. As a result, a metal layer 3 can be produced with sharp edges and steep flanks 7, in a manner that has not been possible before. This achievement required the knowledge that, by the ablation of the cover coat 4, with the production of sharp and steep flanks, it is possible to perform the entire metallization under precise guidance. The method of the invention is especially advantageous whenever it is necessary to increase the thickness of the metal layer 3 at relatively high currents. It is precisely in this case that a precise, vertical shape of the flanks 7 results in special advantages. This is true especially when the conductors are very close together, i.e., when the polarized conductors have a high density. Furthermore, especially in the case of fine patterns there is a need to produce conductors of narrow width. As a result there is again the need, as a rule, especially when comparatively high currents are to be expected, to increase the thickness of the metal layer 3 to handle them.

Figure 3:
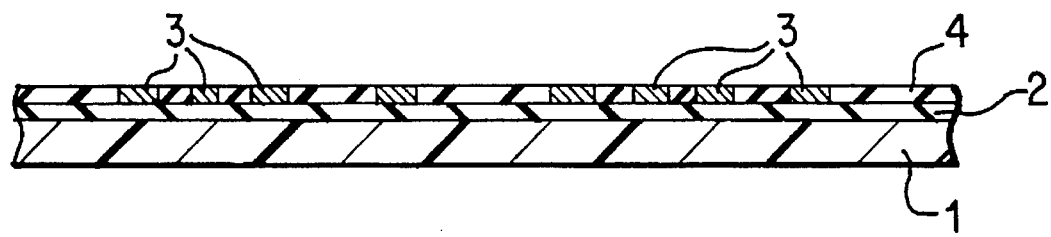
FIG. 3 is a cross section through the printed circuit of FIGS. 1 and 2, with a metal layer set in the patterns.

As can be seen in FIG. 3, after the patterns 6 have been applied to the substrate, i.e., to the circuit board 1, the metal layer 3 is set into the patterns 6. The prime coating 2 exposed in these areas contains components which have a chemically reductive action, so that it is possible to apply the metal layer 3, without electric current, by means of the reductive bath. A current-free metallization of this kind assures uniform layer thicknesses with tolerances of no more than about 0.2 µm. The metal layers 3 can thus be kept extremely thin, and even in the case of metal layers 3 with a thickness of less than 1 µm good electrical conductivities are achieved. The method of the invention can thus be employed to special advantage also in thin-layer technology. The minimal overall depth offers advantages in the case of multi-layer circuitry.

In the process according to the invention, as described above, it is important for the action of the electromagnetic radiation, especially also when a krypton-fluoride excimer laser with a wavelength of 248 nm is used, to be performed with maximum precision, and for the final metallization to be performed always to remain within the traces 6 produced on the on the circuit board 1. This is made possible by the arrangement of the prime coat underneath the cover coat 4 in accord with the invention. Then the build-up of the metal layer 3 is guided with extremely great precision by the sharp-edged and steep flanks 7 of the cover coat 4. The conductors are applied, as a rule, up to the level of the surface of the cover coat 4. The cover coat 4 is applied in a thickness corresponding to the thickness of the desired metal layer. The so-called chemical mushrooming that occurs in conventional metal depositing processes is prevented here by building up of the metal layer with the guidance of the flanks. Since in addition the sometimes unavoidable undercutting of the conductors encountered in prior processes is reliably prevented, it is possible to create conductors and/or isolating channels in a trouble-free manner with very great resolution, i.e., with an extremely narrow width down to about 0.3 µm to 1 µm. It is possible, consequently, to employ the method of the invention as a wiring process in chip-on-board, chip-on-flex and smart-card technology, among others.

It is furthermore of considerable advantage that, by means of the method of the invention, three-dimensional objects bearing electronic circuits, such as the interior of apparatus housings, can be provided in the manner described with metal layers 3 of extremely fine structure. That is because all of the required process steps can easily be performed even on curved surfaces. The prime coat 2 and the cover coat 4 can be applied uniformly enough by spraying the surface even of a greatly curved substrate. The action of the radiation 5 from the excimer laser can likewise be applied with the greatest precision, for example, to any curved surfaces of substrates through a mask of the appropriate shape. Lastly, the final application of the metal layer to curved surfaces in a reducing bath presents no difficulty, either. The process of the invention has the additional advantage that no mordants are used, so that it is a decidedly environmentally friendly process. The patterning, therefore, can be performed at low cost after the installation of the necessary apparatus.

The foregoing description and examples have been set forth merely to illustrate the invention and are not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for patterned metallization of a substrate surface, said method comprising the steps of:

applying an electrically nonconductive catalyst-containing prime coat to the full surface of the substrate;

applying an electrically nonconductive cover coat to the full surface of the prime coat, said cover layer being removable by electromagnetic radiation in the ultraviolet range and being applied in a thickness of at least 1 µm and approximately equal to that of a metal layer to be deposited in the metallization;

ablating partial areas of the cover coat by electromagnetic irradiation in the ultraviolet range to form a pattern having sharp and steep flanks and expose the prime coat in said partial areas; and depositing a metal layer on the exposed prime coat in said partial areas to form electrical conductors, the deposition of the metal being effected in a reducing bath and being guided by the flanks of the cover layer pattern.

2. A method according to claim 1, wherein said substrate is a circuit board.

3. A method according to claim 1, wherein said removing step is carried out by patterned exposure of the cover coat in said partial areas to electromagnetic irradiation by an excimer laser.

4. A method according to claim 3, wherein said removing step is carried out by patterned exposure of the cover coat to radiation from a krypton fluoride excimer laser with a wavelength of 248 nm.

5. A method according to claim 1, wherein the metal layer is deposited in the partial areas of the pattern up to the level of the surface of the cover coat adjacent them.

6. A method according to claim 1, wherein the cover coat is formed of a polymer.

7. A method according to claim 6, wherein said polymer is a polyimide or a polyethylene.

8. A method according to claim 6, wherein the polymer is heat-stable under conditions of soldering.

9. A method according to claim 1, wherein the conductors formed in said partial areas have a width in the range from about 0.3 µm to about 1 µm.

10. A method according to claim 1, wherein the conductors formed in said partial areas are spaced apart a distance in the range from about 0.3 µm to about 1 µm.

11. A method according to claim 1, wherein said ablating step is carried out by exposing the cover coat through a mask.

12. A method according to claim 1, wherein said ablating step is carried out by projecting an image onto the cover coat.

13. A method according to claim 1, wherein said ablating step is performed by means of focused electromagnetic irradiation.

14. A method according to claim 1, wherein said ablating step is performed by means of a focused laser beam.

15. A method according to claim 1, wherein the prime coat contains components which exert a chemically reducing action during the subsequent metal layer depositing step.

16. A method according to claim 1, wherein the prime coat is applied to the substrate surface by brushing, spraying, printing, immersion or precipitation.

\* \* \* \* \*